(12) United States Patent
Laufenberg et al.

(10) Patent No.: US 8,901,786 B2
(45) Date of Patent: Dec. 2, 2014

(54) ACTUATOR

(75) Inventors: Markus Laufenberg, Radolfzell (DE);
Oliver Thode, Bodman-Ludwigshafen (DE)

(73) Assignee: ETO Magnetic GmbH, Stockach (DE)

( * ) Notice: Subject to any disclaimer, the term of this patent is extended or adjusted under 35 U.S.C. 154(b) by 283 days.

(21) Appl. No.: 13/583,386

(22) PCT Filed: Feb. 28, 2011

(86) PCT No.: PCT/EP2011/000959
§ 371 (c)(1),
(2), (4) Date: Sep. 7, 2012

(87) PCT Pub. No.: WO2011/110293
PCT Pub. Date: Sep. 15, 2011

(65) Prior Publication Data
US 2013/0002057 A1    Jan. 3, 2013

(30) Foreign Application Priority Data

Mar. 9, 2010   (DE) .......................... 10 2010 010 801

(51) Int. Cl.
*H01L 41/00* (2013.01)
*H01L 41/12* (2006.01)

(52) U.S. Cl.
CPC ...................................... *H01L 41/12* (2013.01)
USPC .............................................. 310/26; 310/15

(58) Field of Classification Search
USPC .......................................... 310/15, 23–24, 26
See application file for complete search history.

(56) References Cited

U.S. PATENT DOCUMENTS

| 3,419,776 | A | * | 12/1968 | Kuris et al. | 318/118 |
| 5,880,542 | A | * | 3/1999 | Leary et al. | 310/26 |
| 5,958,154 | A | | 9/1999 | O'Handley et al. | |
| 6,498,416 | B1 | * | 12/2002 | Oishi et al. | 310/214 |
| 6,624,539 | B1 | * | 9/2003 | Hansen et al. | 310/26 |
| 6,747,377 | B2 | * | 6/2004 | Ullakko | 310/26 |
| 6,827,331 | B1 | * | 12/2004 | Roos | 251/129.15 |

(Continued)

FOREIGN PATENT DOCUMENTS

| DE | 295027975 | 6/1995 |
| DE | 102005038891 | 2/2007 |

(Continued)

OTHER PUBLICATIONS

International Search report dated Jun. 17, 2011.

(Continued)

*Primary Examiner* — Thanh Lam
(74) *Attorney, Agent, or Firm* — Bachman & LaPointe, PC

(57) ABSTRACT

Actuator having a drive element (16) which can be driven in reaction to electrical operation of a coil device (14), said drive element consisting of a magnetic shape-memory material and being designed to transmit mechanical drive energy to an actuating partner (28), wherein the drive element, which is in the form of an expansion unit (16) and is aligned such that it extends in a drive direction (22), is associated with a pair of laterally adjacent magnetic flux guide elements (18, 20) for a magnetic flux produced by the coil device, such that the magnetic flux is guided between the flux guide elements through the expansion unit and transversely with respect to the drive direction, the coil device (14) being provided such that it is circumferential around the expansion unit (16) which extends axially in the drive direction.

17 Claims, 1 Drawing Sheet

(56) References Cited

U.S. PATENT DOCUMENTS

| | | | |
|---|---|---|---|
| 6,864,771 B2 * | 3/2005 | Komiyama et al. | 335/220 |
| 7,688,168 B2 * | 3/2010 | Taya et al. | 335/215 |
| 8,016,952 B2 | 9/2011 | Ishida et al. | |
| 8,237,525 B2 | 8/2012 | Hoang et al. | |
| 2003/0057394 A1 | 3/2003 | Makino | |
| 2007/0081679 A1 * | 4/2007 | Suzuki et al. | 381/152 |
| 2007/0267922 A1 * | 11/2007 | Uni | 310/26 |
| 2008/0284547 A1 | 11/2008 | Claeys et al. | |

FOREIGN PATENT DOCUMENTS

| | | |
|---|---|---|
| EP | 1 069 200 | 1/2001 |
| GB | 2 445 773 | 7/2008 |
| WO | 01/16484 | 3/2001 |
| WO | 2008/104961 | 9/2008 |
| WO | 2009/135501 | 11/2009 |

OTHER PUBLICATIONS

German Office action dated Feb. 11, 2011.

* cited by examiner

ACTUATOR

BACKGROUND OF THE INVENTION

The present invention relates to an actuator having a drive element which can be driven in reaction to electrical operation of a coil device, said drive element consisting of magnetic shape-memory material according to the preamble of the main claim.

Such devices are known from the prior art and utilise the effect that, under the influence of a magnetic field, so-called shape-memory materials (also frequently called shape-memory alloys, MSMA) perform an expansion movement which in the direction of expansion (=drive direction) is typically in the low single-figure percentage range relative to the length of the element.

In such devices, there is the principal requirement that the magnetic field effecting the expansion and/or the longitudinal alteration of the drive element has to be located perpendicular to the expansion and/or drive direction (working axis). Accordingly, for electromagnetic coil devices which generate the required magnetic field, this means that said coil devices (for example in a coil pair) have to be located with their axis of symmetry perpendicular to the working direction of the actuator. This results in large constructional spaces (which is frequently disadvantageous), in particular when two coils are provided symmetrically on both sides of the shape-memory element.

It is, therefore, known from the prior art to use drive elements consisting of a magnetic shape-memory material at different points along a magnetic circuit (namely in a gap formed between housing elements of a magnetically conductive housing) which, however, results in mechanically complex and/or geometrically and structurally complicated embodiments which also do not provide the mechanical drive energy in an optimal manner.

In particular, none of the known embodiments for acting on a magnetic shape-memory material to produce an actuator permits the use of commonly available sub-assemblies and components, as are known from conventional embodiments of electromagnetic actuators, namely elongate, axially extending armature tappets which are surrounded by a typically cylindrical coil (and for which the installation spaces are typically dimensioned, namely in a motor vehicle).

SUMMARY OF THE INVENTION

It is, therefore, the object of the present invention to improve and to develop further an actuator device having a drive element consisting of magnetic shape-memory (alloy) material according to the preamble of the main claim, such that an embodiment with a simplified magnetic construction is produced, in particular compact dimensions of the actuator device may be achieved and the mechanical drive energy of the drive element may be transmitted in a simple manner to an actuating partner, namely a tappet or the like.

The object is achieved by the actuator having the features of the main claim. Advantageous developments of the invention are disclosed in the sub-claims.

In an advantageous manner according to the invention a pair of flux guide elements, which are laterally adjacent (and preferably in contact), are assigned to the expansion unit produced from magnetic shape-memory material and cooperating in an otherwise known manner with an actuating partner, namely an elongate tappet or valve part, such that the flux guide elements receive the expansion unit between one another and in the flux guide region (contact region) ensure a magnetic flux guidance through the expansion unit, which extends transversely to the drive direction, i.e. is optimal geometrically with regard to the desired expansion effect under the action of the magnetic field. (In this case the term "transverse" to the drive direction is not necessarily understood as a perfect right angle; in practice it has proved to be sufficient and/or expedient simply to provide a significant transverse vector component, so that "transverse" within the scope of the invention may also be understood as a magnetic flux path—relative to the drive direction—which extends in an angular range of ca. 80° to 100°, preferably 85° to 95°).

By means of the flux guide elements, therefore, the invention is based on the idea, on the one hand, of ensuring the optimal flux through the shape-memory material for the actuator and, on the other hand, of providing the requirements for an exceptionally compact constructional shape of the entire arrangement, which, in particular, offers the possibility of replicating the mechanical structure and mode of operation of a known electromagnetic actuating device (an axially movable armature with a tappet inside a coil winding formed on the external periphery).

Thus, it is provided and claimed according to the invention to form the coil device on the periphery about a longitudinal axis, the drive direction and direction of extension of the expansion unit following said longitudinal axis. A radially symmetrical shape is particularly suitable and other cross sectional shapes of, for example, the coil unit are nevertheless possible (for example, a square or rectangular cross-sectional contour, optionally with suitably rounded corners).

According to this feature of the invention, therefore, the working direction (drive direction) of the expansion unit extends along said axis of symmetry of the coil (i.e. the imaginary axis extending through the coil interior). Such a coil arrangement which, relative to the object set forth, advantageously corresponds to the known housing shapes, is nevertheless not ideal with regard to a magnetic flux in the expansion unit extending transversely to the drive direction, so that according to the invention the flux guide elements provided in the claimed manner advantageously produce a corresponding flux guidance.

It is particularly advantageous and effective for achieving the flux guidance according to the invention, therefore, if at least one of the flux guide elements, preferably both of the pair of flux guide elements, extend axially and/or in the drive direction along the length of the expansion unit, namely along the entire extent thereof. This, therefore, has the advantageous effect of efficient introduction of flux into the shape-memory material with minimal magnetic losses. At the same time, according to a further preferred embodiment of the invention as a preferred exemplary embodiment, by a suitable design of the flux guide elements namely in the shape of arms, arm segments or the like which also extend in the drive direction and/or axially parallel, said geometry may be implemented in a space-saving manner (in particular with regard to the width).

In this case, in principle, any cross-sectional contour of the flux guide elements is suitable, but it is advantageous—for cooperating with a shape-memory material as the expansion unit which is typically rectangular or polygonal in cross section—if the flux guide element forms at least one correspondingly planar contact surface, so as to ensure once again in this regard the flux coupling with the shape-memory material in a manner which is as advantageous and with as few losses as possible. In a substantially radially symmetrical context, it is preferably provided by way of example to configure the axially opposing flux guide elements which come into contact with the shape-memory material between one another, to be in the shape of a cylindrical section and/or cylindrical segment in cross section, the correspondingly planar face then producing the contact with the shape-memory material.

In this case, on the one hand, it is within the scope of the invention to provide one or two U-shaped flux guide parts, in particular the stamping and/or bending technique described above also being advantageously suitable for mass production.

Within the scope of the invention it is also not necessary to provide the flux guide elements with the same and/or a uniform cross section in their longitudinal dimension. Instead, numerous variants (influencing the magnetic flux) are available, such as projections, recesses, bevels and/or portions running towards one another, in order to optimise a magnetic flux path and/or an associated introduction into the shape-memory material depending on the desired purpose of use and/or magnetic behaviour.

Alternatively, it is advantageous and preferred in the embodiment (for example by means of stamping technology from suitable sheet metal which is capable of being stamped) to design the flux guide elements to be rectangular or polygonal in cross section (with more than four planar lateral surfaces).

With regard to an embodiment of the magnetic circuit, for coupling the flux guide elements (and thus for producing the magnetic flux via the shape-memory material) there are numerous preferred options; thus for example it is advantageous and preferred to produce the shape-memory material (in the axial direction) on both sides between flux guide elements configured in the shape of arms (with in each case one free end), which are laterally in contact with the shape-memory material between one another in the respective free end region.

In particular from the point of view of suitability for mass production and optimised automated manufacturability, it is provided to retain the flux guide elements by, for example, plastics material (as a non-magnetically conductive material) being injection-moulded around said elements, further actuator components, namely a coil support for the coil device, then being able to be produced from this plastics material simultaneously during an injection-moulding process, in a further preferred manner.

According to a preferred embodiment of the invention, the shape-memory material which has been expanded as a reaction to being subjected to the magnetic field is restored by the action of a restoring element preferably cooperating axially therewith, namely implemented by an energy store (typically a compression spring). Alternatively, a cooperation with a second element consisting of shape-memory material is also conceivable which, for example, is arranged in a similar manner but in reverse, is activated to restore the expanded (first) drive element.

Whilst within the scope of embodiments of the invention which may be manufactured easily and which are suitable for mass production, it might generally be common practice to bring into contact a central drive element consisting of the magnetic shape-memory material on both sides on the external periphery, it is nevertheless within the scope of the present invention to design the drive element, which consists of the magnetic shape-memory material, to be hollow cylindrical, and to introduce the magnetic flux radially into the material so that, on the one hand, external contact is made on the external periphery by a first flux guide element, and, on the other hand, contact is made on the inside, for example by an axially extending pin-shaped flux guide element, with the result that in terms of cross section a radial flux path is produced by a disc-shaped shape-memory element.

As a result, the present invention permits the otherwise known mechanical expansion effects of magnetic shape-memory materials to be utilised in a surprisingly simple and elegant manner to produce an actuator which is structurally simple, permits a very compact constructional shape and, in particular, exhibits no increase in the width, namely relative to conventionally known cylindrical electromagnetic actuating devices. Accordingly, the actuating device produced by the present invention provides the option of using the available installation spaces, and thus potentially of permitting completely new fields of use for magnetically induced actuator technology based on shape-memory materials.

BRIEF DESCRIPTION OF THE DRAWINGS

Further advantages, features and details of the invention are revealed from the following description of preferred exemplary embodiments and with reference to the drawings, in which.

DETAILED DESCRIPTION

Figure 1:
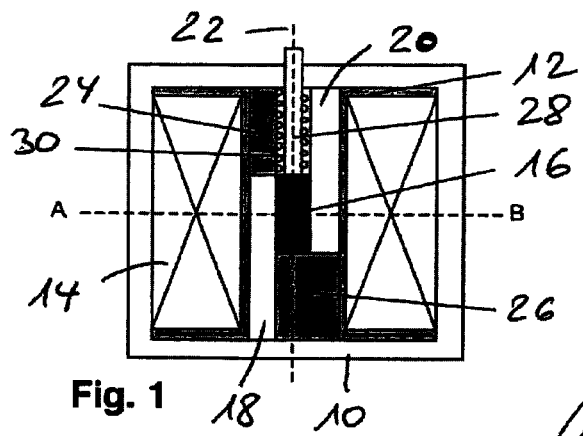
FIG. 1 shows a schematic longitudinal view through the actuator according to a first preferred embodiment of the invention.

FIG. 1 shows in a schematic longitudinal section how within a hollow cylindrical housing 10 (shown in one piece for reasons of simplicity) consisting of magnetically conductive material, a coil winding 14 held on a coil support 12 encloses a drive element 16 which is formed from a shape-memory material (MSM element and/or MSMA element) typically produced by means of a NiMnGa alloy in an otherwise known manner. The magnetic field of the cylinder coil 14 is guided via the housing 10 to a pair of magnetically conductive flux guide elements 18, 20 which protrude in an elongate manner in the manner shown in FIG. 1, from a bottom wall and/or front wall (relative to an axial drive direction 22), and enclose between one another, between their respective free end portions, the elongate shape-memory element 16 itself, which is rectangular in cross section, for generating the transmission of magnetic flux.

Figure 2:
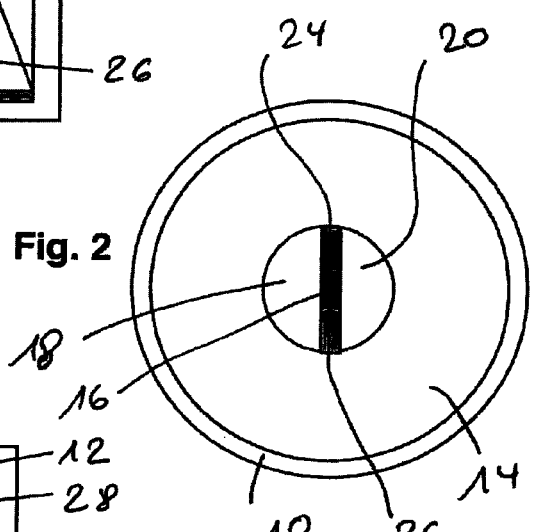
FIG. 2 shows a cross-sectional view along the cutting line A-B in FIG. 1.

FIG. 2 shows details of said geometric arrangement in a cross-sectional view along the cutting plane A-B in FIG. 1; it is clear that within the cylindrical external housing 10 and the cylinder coil 14 the pair of flux guide elements 18, 20 in cross section is circular segment-shaped (so that the elongate bodies 18, 20 in turn have the shape of a cylindrical section), the respective planar faces of the circular segments being oriented towards one another and holding in contact between one another the drive element 16 which is rectangular in cross section.

As may be advantageously identified once again in FIG. 1, the flux guide elements for closing the housing cavities are surrounded and/or embedded in material regions 24, 26 consisting of material which is magnetically non-conductive (for example plastics, which is suitably shaped by injection-moulding or other methods) in a manner which is particularly advantageous in terms of production technology, such plastics material also being able to be used in order to produce the coil support 12 for the cylindrical coil winding 14.

As may also be identified in FIG. 1, the drive element 16 is supported against a (non-magnetically conductive) material portion 26 and forms in an axially opposing manner an engagement end for cooperating with a tappet unit 28 as an actuating partner which in an otherwise known manner may then be brought into contact on the output side for further transmission of the mechanical actuating energy.

FIG. 1 additionally shows a compression spring 30 provided in the housing and pretensioned counter to the direction of extension of the drive element 16, said compression spring acting as a restoring element and, in particular, having the purpose of returning the expanded drive element after it has been subjected to the magnetic field into its original (contracted) position counter to the drive direction.

The operation of the first embodiment of the present invention shown with reference to FIG. 1 and/or 2 is as follows: as a reaction to the application of current to the coil winding 14, a magnetic flux is generated which is applied by the flux guide elements 18, 20 to the drive element 16 for closing the magnetic circuit, such that the magnetic flux is guided through the element 16 in the horizontal direction (i.e. parallel to the cutting line A-B and transversely to the drive axis 22). This permits, as discussed above, optimised expansion behaviour of the element 16 as a reaction to being subjected to the magnetic field, not least because, as FIG. 1 shows, both flux guide elements 18, 20 are designed in the drive direction so that said elements cover the entire axial extent of the drive element and in this regard ensure maximum transmission of magnetic flux into the drive element.

The expansion of the drive element produced as a reaction to the magnetic flux is mechanically transmitted to the tappet 28 which, depending on the expansion (a typical value is ca. 5% of the axial overall length of the drive element), is moved out of the housing 10 and is available for coupling to an external actuating partner. After the current has been applied, the compression spring 30 which is supported against the housing front face causes a mechanical return of the drive element into the initial position.

Figure 3:
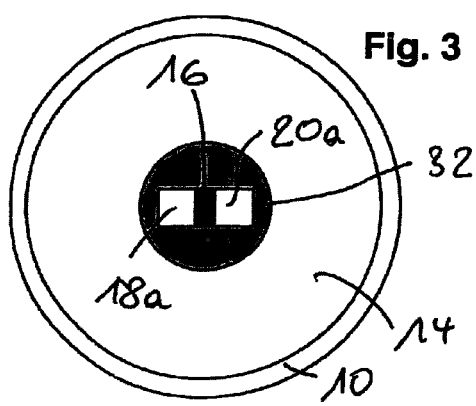
FIG. 3, FIG. 4 show variants of the view of FIG. 2 with alternative cross-sectional geometries of the flux guide elements
Figure 4:
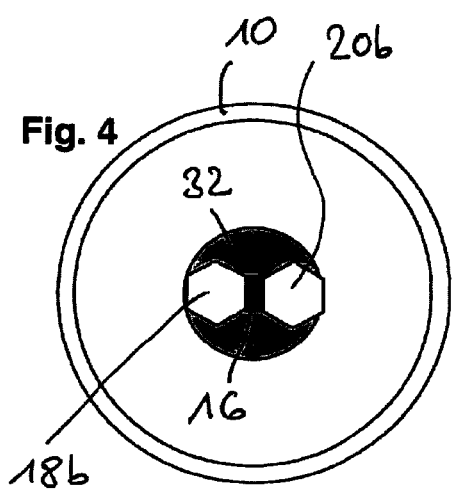

FIGS. 3 and 4 illustrate further variants of advantageous cross-sectional geometries of the flux guide elements within the scope of the invention. Similar to the view according to FIG. 2, the variant of FIG. 3 provides that the flux guide elements are in each case configured to be rectangular and/or square in cross section in the form of rods 18*a* and/or 20*a* and in turn in contact with the drive element 16 on the planar faces. Such a design might be advantageous, in particular, in terms of production technology as the flux guide elements, namely as stamped parts, are advantageously suitable for being able to be mass-produced. Once again, plastics material 32 is injection-moulded around the arrangement within the cylinder coil 14.

In turn, alternatively, the flux guide elements 18*b* and/or 20*b* of the embodiment according to FIG. 4 are hexagonal in cross section, one respective planar face being once again in contact with the shape-memory material 16 on opposing sides, similar to the view of FIG. 1.

Figure 5:
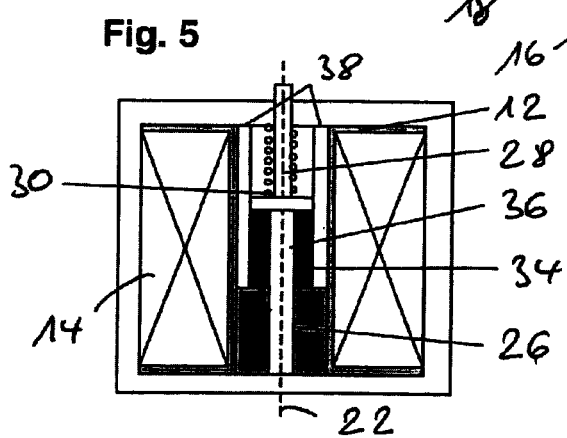
FIG. 5 shows a schematic longitudinal sectional view similar to FIG. 1 for illustrating a second embodiment of the present invention.

FIG. 5 shows a variant of the embodiment described above in which the drive element (in this case reference numeral 34) is not configured as a body provided axially and centrally but as a hollow cylindrical element, which—within an installation context otherwise comparable with FIG. 1—is brought into contact on the inside with a pin-shaped first flux guide element 36 and on the external periphery on the outside with a sleeve-shaped and/or hollow cylindrical second flux guide element 38. Accordingly, in this case a magnetic flux is also ensured transversely to the drive direction and longitudinal axis of movement 22, the field extending radially between the first flux guide element 36 and the second, surrounding flux guide element 38, through the intermediate hollow cylindrical and/or sleeve-shaped shape-memory material.

The present invention is not limited to the exemplary embodiments shown. For example, any shape of coil is suitable and a cylindrical coil shape is not necessarily required, as shown in the figures (even when this is advantageous, namely with regard to existing installation conditions for magnetic actuators). In the exemplary embodiments shown, the shape-memory drive element is also produced as cuboidal and/or rectangular in cross section, but this is not necessary because in addition to other geometric embodiments, a plurality of individual elements may also be arranged adjacent to or above one another, and act in parallel and/or in series.

The invention claimed is:

1. Actuator having a drive element (16) which can be driven in reaction to electrical operation of a coil device (14), said drive element consisting of a magnetic shape-memory material and being designed to transmit mechanical drive energy to an actuating partner (28), wherein the drive element, which is in the form of an expansion unit (16) and is aligned such that it extends in a drive direction (22), is associated with a pair of laterally adjacent magnetic flux guide elements (18, 20) for a magnetic flux produced by the coil device, such that the magnetic flux is guided between the flux guide elements through the expansion unit and transversely with respect to the drive direction, the coil device (14) being provided such that it is circumferential around the expansion unit (16) which extends axially in the drive direction.

2. Actuator according to claim 1, wherein the coil device forms an internal axis of symmetry which extends parallel to the drive direction.

3. Actuator according to claim 1, wherein at least one of the pair of flux guide elements (18, 20) extends in the drive direction along the length of the expansion unit.

4. Actuator according to claim 1, wherein the expansion unit has a rectangular cross section and is in contact on two opposing peripheral surfaces with the pair of flux guide elements (18, 20).

5. Actuator according to claim 1, wherein at least one of the pair of flux guide elements forms a planar surface for coming into contact with the expansion unit.

6. Actuator according to claim 1, wherein at least one of the pair of flux guide elements at least partially in cross section has the shape of a cylindrical section (18, 20), rectangle (18*a*, 20*a*) or polygon (18*b*, 20*b*).

7. Actuator according to claim 1, wherein at least one of the pair of flux guide elements is formed as an arm or arm portion extending in the drive direction.

8. Actuator according to claim 1, wherein the flux guide elements of the pair of flux guide elements are configured to extend in the drive direction of opposing portions of a magnetically conductive coil housing (10).

9. Actuator according to claim 1, wherein the pair of magnetic flux guide elements is embedded at least partially in a non-magnetic material (24, 26).

10. Actuator according to claim 9, wherein the non-magnetic material forms a coil support (12) for the coil device.

11. Actuator according to claim 1, wherein a restoring element (30), is arranged axially to the expansion unit and configured to exert a restoring force thereon.

12. Actuator according to claim 1, wherein the expansion unit is formed as a hollow cylindrical body (34) consisting of the magnetic shape-memory material, which on the external periphery cooperates with a first flux guide element (38), of the pair of magnetic flux guide elements and on the inside with a pin-shaped second flux guide element (36) of the pair of flux guide elements.

13. Actuator according to claim 1, wherein the coil device is radially circumferential around the expansion unit (16) which extends axially in the drive direction.

14. Actuator according to claim 2, wherein the internal axis of symmetry extends coaxially to the drive direction.

15. Actuator according to claim 9, wherein the non-magnetic material is a plastics material.

16. Actuator according to claim 11, wherein the restoring element (30) is a restoring spring.

17. Actuator according to claim 12, wherein the first flux guide element (38) is of hollow cylindrical configuration.

\* \* \* \* \*